United States Patent
Hwang et al.

(12)

(10) Patent No.: US 11,114,165 B2
(45) Date of Patent: Sep. 7, 2021

(54) SEMICONDUCTOR DEVICES HAVING INCREASED EFFICIENCY IN GENERATION OF GATE-INDUCED DRAIN LEAKAGE CURRENT WITHOUT INSULATION DETERIORATION AND METHODS OF OPERATING THE SAME

(71) Applicant: Samsung Electronics Co., Ltd., Suwon-si (KR)

(72) Inventors: Doohee Hwang, Uiwang-si (KR); Taehun Kim, Gwacheon-si (KR); Minkyung Bae, Hwaseong-si (KR); Myunghun Woo, Suwon-si (KR); Bongyong Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/821,225

(22) Filed: Mar. 17, 2020

(65) Prior Publication Data

US 2021/0065809 A1 Mar. 4, 2021

(30) Foreign Application Priority Data

Sep. 3, 2019 (KR) .......................... 10-2019-0108759

(51) Int. Cl.
*G11C 16/32* (2006.01)
*G11C 16/14* (2006.01)
(Continued)

(52) U.S. Cl.
CPC .............. *G11C 16/14* (2013.01); *G11C 5/063* (2013.01); *G11C 11/5635* (2013.01); *G11C 16/045* (2013.01); *G11C 16/0483* (2013.01); *G11C 16/08* (2013.01); *G11C 16/12* (2013.01); *G11C 16/16* (2013.01); *G11C 16/24* (2013.01); *G11C 16/30* (2013.01); *G11C 16/32* (2013.01); *H01L 27/11582* (2013.01)

(58) Field of Classification Search
CPC ..... G11C 16/0483; G11C 16/14; G11C 16/32; G11C 16/045; G11C 16/12; G11C 16/24
See application file for complete search history.

(56) References Cited

U.S. PATENT DOCUMENTS

| | | | |
|---|---|---|---|
| 7,277,327 B2 | 10/2007 | Mihnea et al. | |
| 7,489,549 B2 | 2/2009 | Mokhlesi | |

(Continued)

FOREIGN PATENT DOCUMENTS

JP 2008-140488 A 6/2008

*Primary Examiner* — Mushfique Siddique
(74) *Attorney, Agent, or Firm* — Harness, Dickey & Pierce, P.L.C.

(57) ABSTRACT

A semiconductor device includes a source layer; a plurality of channel structures; a plurality of gate electrodes; and a common source line. At least one of the plurality of gate electrodes provides a GIDL line. For an erasing operation, an erasing voltage applied to the common source line reaches a target voltage, and, after the erasing voltage reaches the target voltage, a step increment voltage is applied to the erasing voltage, such that the erasing voltage has a voltage level higher than a voltage level of the target voltage. After the step increment voltage has been applied for a desired time period, the voltage level of the erasing voltage is decreased to the target voltage level for the remainder of the erasing operation.

20 Claims, 13 Drawing Sheets

(51) Int. Cl.
*G11C 16/04* (2006.01)
*G11C 16/24* (2006.01)
*G11C 16/12* (2006.01)
*G11C 11/56* (2006.01)
*H01L 27/11582* (2017.01)
*G11C 16/08* (2006.01)
*G11C 16/16* (2006.01)
*G11C 16/30* (2006.01)
*G11C 5/06* (2006.01)

(56) References Cited

U.S. PATENT DOCUMENTS

| | | |
|---|---|---|
| 7,995,394 B2 | 8/2011 | Dong et al. |
| 9,437,310 B2* | 9/2016 | Oh .................... G11C 16/3468 |
| 9,520,197 B2 | 12/2016 | Fitzpatrick et al. |
| 9,852,800 B2 | 12/2017 | Lang et al. |
| 2008/0130363 A1 | 6/2008 | Hosono |
| 2012/0170375 A1* | 7/2012 | Sim .................... G11C 16/0483 365/185.19 |
| 2015/0097222 A1* | 4/2015 | Lee .................... H01L 27/1157 257/314 |
| 2018/0294270 A1 | 10/2018 | Lee et al. |
| 2019/0122741 A1 | 4/2019 | Cheng et al. |
| 2019/0279720 A1* | 9/2019 | Nam .................. G11C 16/0483 |
| 2019/0378574 A1* | 12/2019 | Lee ........................ G11C 16/16 |
| 2020/0144285 A1* | 5/2020 | Lee .................... H01L 27/1157 |
| 2020/0303011 A1* | 9/2020 | Park ....................... G11C 16/08 |
| 2020/0381446 A1* | 12/2020 | Choi ................ H01L 27/11556 |
| 2020/0395379 A1* | 12/2020 | Lee .................. H01L 27/11529 |
| 2020/0411105 A1* | 12/2020 | Lee ........................ H01L 25/18 |

\* cited by examiner

SEMICONDUCTOR DEVICES HAVING INCREASED EFFICIENCY IN GENERATION OF GATE-INDUCED DRAIN LEAKAGE CURRENT WITHOUT INSULATION DETERIORATION AND METHODS OF OPERATING THE SAME

CROSS-REFERENCE TO RELATED APPLICATION(S)

This U.S. non-provisional application claims benefit of priority to Korean Patent Application No. 10-2019-0108759, filed on Sep. 3, 2019 in the Korean Intellectual Property Office, the disclosure of which is incorporated herein by reference in its entirety.

BACKGROUND

Various example embodiments relate to semiconductor devices, systems including semiconductor devices, and/or methods of operating the semiconductor devices.

With increasing demand for memory devices with a small size and high capacity, research into memory devices having vertically stacked memory cells, has been actively conducted. Recently, a selective epitaxial growth (SEG) process has been omitted from the manufacturing process of memory devices to improve the integration density of a memory device, and to reduce manufacturing costs of the memory device. Accordingly, various methods have been studied to increase the efficiency of gate-induced drain leakage (GIDL) erasure.

SUMMARY

Various example embodiments provide a semiconductor device, capable of increasing the efficiency of generation of a gate-induced drain leakage (GIDL) current without inducing the deterioration of an insulating material between a GIDL line and a vertical channel layer.

According to at least one example embodiment, a semiconductor device may include: a source layer on a substrate; a plurality of channel structures on the substrate, the plurality of channel structures each including a vertical insulating layer and a vertical channel layer, the plurality of channel structures extending in a first direction perpendicular to an upper surface of the substrate; a plurality of gate electrodes on the source layer and spaced apart from each other along the first direction on a sidewall of each of the plurality of channel structures, and at least one gate electrode of the plurality of gate electrodes is configured to provide a gate-induced drain leakage (GIDL) line; a common source line penetrating through the plurality of gate electrodes, the common source line extending in the first direction and electrically connected to the source layer; and a memory controller configured to, during an erasing operation, apply an erasing voltage to the common source line until the erasing voltage reaches a target voltage, increase the erasing voltage to a desired step-up voltage which has a level higher than a level of the target voltage, for a desired step-up time period after the erasing voltage reaches the target voltage, and reduce the erasing voltage to the target voltage after the desired step-up time period expires.

According to at least one example embodiment, a semiconductor device may include: a plurality of bitlines; a common source line configured to receive an erasing voltage during an erasing operation; at least one memory cell string connected between one bit line of the plurality of bitlines and the common source line, the at least one memory cell string including a plurality of memory cells, and at least one string select line connected to the one bit line; a gate-induced drain leakage (GIDL) line electrically connected to the common source line, the GIDL line configured to receive a GIDL voltage, the received GIDL voltage being increased while maintaining a constant potential difference with the erasing voltage applied to the common source line until the erasing voltage reaches a target voltage during the erasing operation; a ground select line on the GIDL line; a plurality of wordlines between the string select line and the ground select line. Overshoot occurs to apply a voltage higher than the target voltage after the erasing voltage, applied to the common source line, reaches the target voltage during the erasing operation.

According to at least one example embodiment, a semiconductor device may include: a substrate; a source layer on an upper surface of the substrate; a plurality of gate electrode layers, the plurality of gate electrode layers includes a lowermost gate electrode configured to provide a gate-induced drain leakage (GIDL) line; a plurality of insulating layers, the plurality of insulating layers and the plurality of gate electrode layers stacked alternately on the source layer; a plurality of channel structures, each of the plurality of channel structures having a vertical insulating layer and a vertical channel layer, the plurality of channel structures extending in a first direction perpendicular to the upper surface of the substrate; a common source extension region including a portion of the source layer which extends along the vertical channel layer, the common source extension region formed to overlap at least a portion of the GIDL line; and a memory controller configured to provide a high magnitude voltage to the source layer during an erasing operation, the high magnitude voltage having a greater than a magnitude of an erasing voltage of the erasing operation.

According to at least one example embodiment, a method of operating a semiconductor device including at least one memory cell string, the at least one memory cell string including a plurality of memory cells, the method may include: increasing an erasing voltage to a target voltage during an erasing operation of the semiconductor device, the erasing voltage applied to a common source line, adding a step increment voltage to the erasing voltage for a desired period of time after the erasing voltage reaches the target voltage, such that the erasing voltage has a voltage level higher than a voltage level of the target voltage, and decreasing the erasing voltage to the target voltage after adding the step increment voltage to the erasing voltage.

BRIEF DESCRIPTION OF DRAWINGS

The above and other aspects, features, and advantages of various example embodiments of the inventive concepts will be more clearly understood from the following detailed description, taken in conjunction with the accompanying drawings, in which.

DETAILED DESCRIPTION

Figure 1:
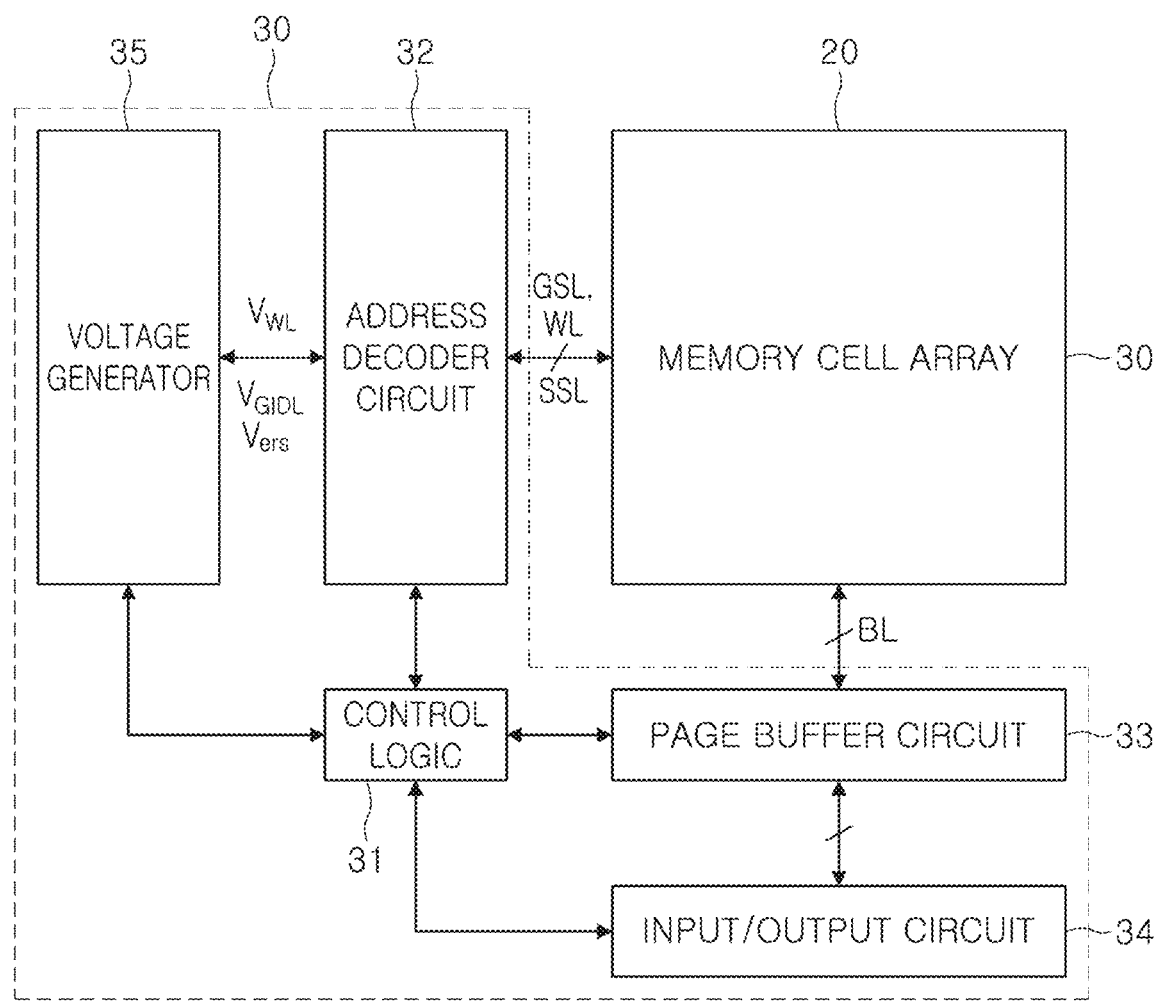
FIG. 1 is a block diagram of a memory device according to at least one example embodiment.

Hereinafter, various example embodiments will be described with reference to the accompanying drawings. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram of a memory device according to at least one example embodiment.

Referring to FIG. 1, a memory device 10 according to at least one example embodiment may include a memory cell array 20 and/or a memory controller 30, etc., but the example embodiments are not limited thereto, and for example, the memory device 10 may include a greater or lesser number of constituent components. The memory cell array 20 may include a plurality of memory cells, and at least a portion of the plurality of memory cells may be connected to each other to provide at least one memory cell string. The memory cell array 20 may include a plurality of memory cell strings, and the plurality of memory cell strings may be divided into a plurality of blocks (e.g., memory blocks). The memory controller 30 may include a control logic 31, an address decoder circuit 32, a page buffer circuit 33, an input/output circuit 34, and/or a voltage generator 35, etc., but the example embodiments are not limited thereto.

In at least one example embodiment, the address decoder circuit 32 may be connected to memory cells MC through a wordline WL, a string select line SSL, a ground select line GSL, and the like, and the page buffer circuit 33 may be connected to the memory cells MC through a bitline BL. In at least one example embodiment, the address decoder circuit 32 may select a memory cell MC to perform memory operations, such as write data, read data, and/or erase data, etc., and may receive address information for selecting a memory cell MC from the control logic 31. A voltage generator 35 configured to generate a plurality of control voltages, an address decoder circuit configured to connect the plurality of control voltages to the word line in response to the received address information.

The page buffer circuit 33 may perform page operations on memory cells MC of the memory cell array 20, such as writing data into the memory cell MC, reading data from the memory cell MC, and/or erasing data from the memory cell MC, etc., and may perform the page operations (e.g., write, read, erase data, etc.) in units of pages. The page buffer circuit 33 may include a plurality of page buffers, and each of the plurality of page buffers may be connected to at least one bitline BL. Data to be written into the memory cell array 20 by the page buffer circuit 33 and/or data read from the memory cell array 20, etc., by the page buffer circuit 33 may be input/output through the input/output circuit 34. Operations of the address decoder circuit 32, the page buffer circuit 33, the input/output circuit 34, and the voltage generator 35 may be controlled by the control logic 31.

The memory controller 30 may include hardware including logic circuits; a hardware/software combination such as at least one processor executing software; or a combination thereof. For example, the memory controller more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to at least one example embodiment, an erasing operation of the memory cell array 20 may be performed using a gate induced drain leakage (GIDL) scheme, but the example embodiments are not limited thereto. The erasing voltage may be generated by the memory controller 30, for example by the voltage generator 35, and applied to a common source line in the memory device 10 performing the erasing operation using the GIDL scheme. When the erasing voltage is applied to the common source line, an overshoot may intentionally occur wherein a voltage higher than a target voltage is applied for a short time after the erasing voltage reaches the target voltage. Accordingly, since a GIDL current is increased, the efficiency of the generation of the GIDL current may be increased and/or improved.

Figure 2:
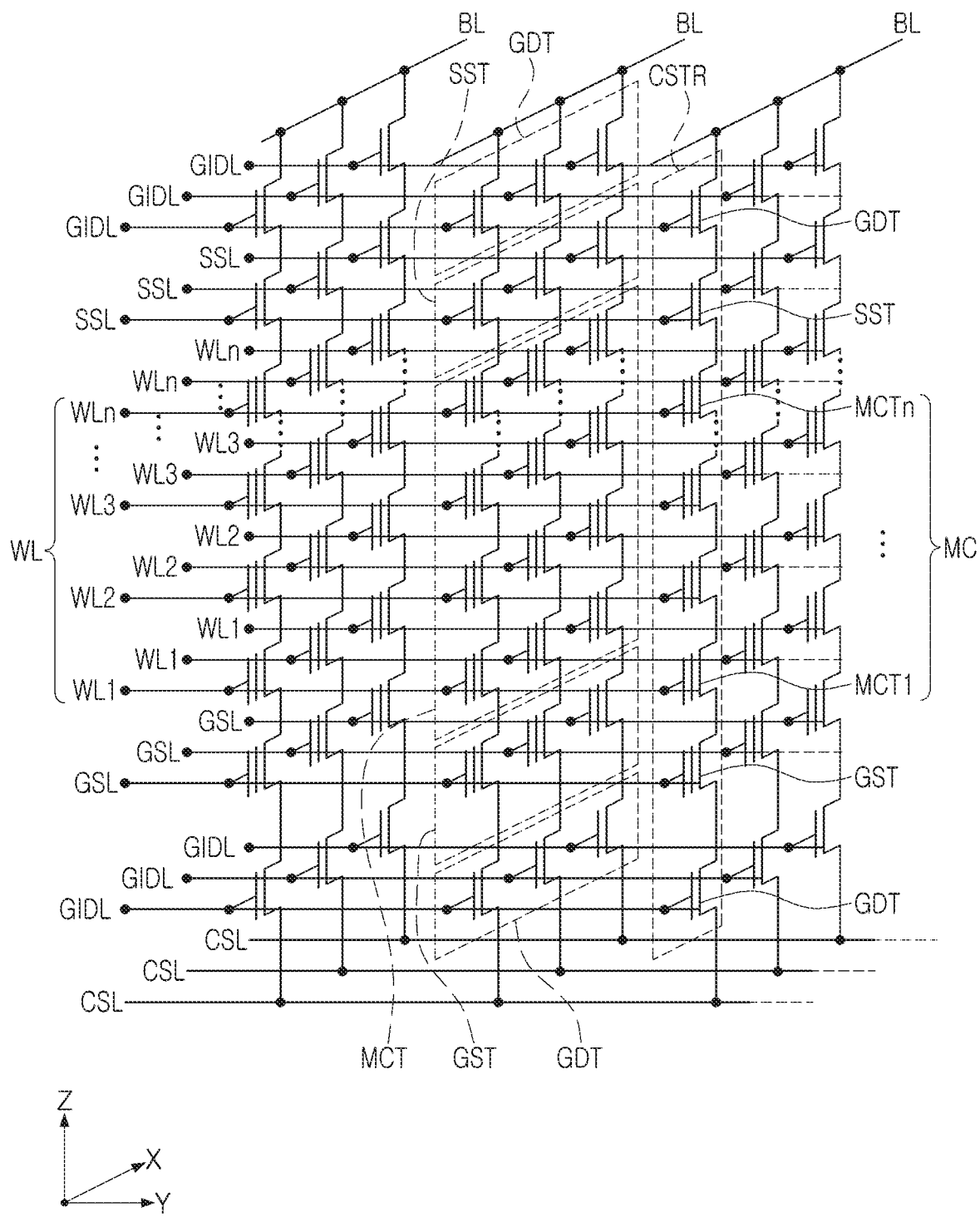
FIG. 2 illustrates a memory cell array included in a memory device according to at least one example embodiment.
Figure 3:
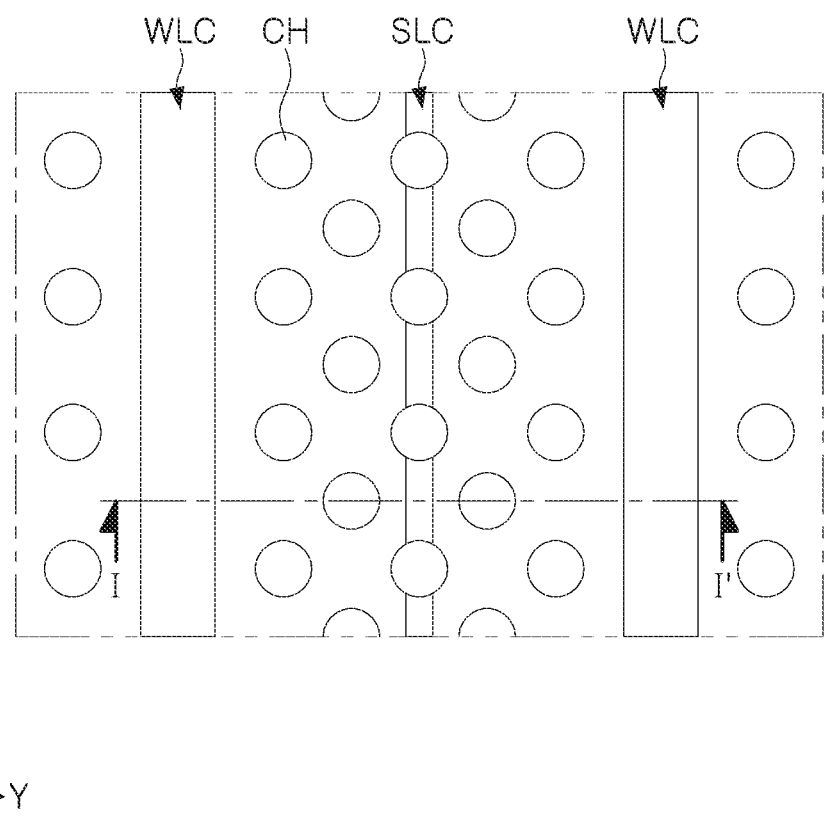
FIG. 3 is a schematic plan view illustrating a memory cell array of a three-dimensional semiconductor device according to at least one example embodiment.

FIG. 2 illustrates a memory cell array included in a memory device according to at least one example embodiment, and FIG. 3 is a schematic plan view illustrating a memory cell array of a three-dimensional semiconductor device according to at least one example embodiment.

Referring to FIG. 2, a memory cell array includes a common source line CSL, a plurality of bitlines BL, a plurality of string select lines SSL, a plurality of memory cell strings CSTR between the common source line CSL and the bitlines BL, a plurality of GIDL lines GIDL, and/or a plurality of ground select lines GSL, etc., but is not limited thereto.

The memory cell array may include a plurality of memory cells MC, etc. Each of the memory cells MC may be connected to a plurality of wordlines WL and a plurality of bitlines BL to operate. For example, each of the memory cells MC may be connected to a single wordline WL and a single bitline BL. The plurality of memory cells MC may be connected to each other in series to provide a single memory cell string CSTR, but are not limited thereto.

The bitlines BL may be two-dimensionally arranged, and a plurality of memory cell strings CSTR may be connected to each of the bitlines BL in parallel. The common source line CSL may be an impurity region formed in a substrate. The plurality of memory cell strings CSTR may be commonly connected to the common source line CSL. A plurality of memory cell strings CSTR may be between the plurality of bitlines BL and the common source line CSL.

According to some example embodiments, the common source line CSL may include a plurality of common source lines, which may be two-dimensionally arranged. An electrically equivalent voltage may be applied to all of the common source lines CSL, or each of the common source lines CSL may be electrically controlled individually or in groups.

Each of the memory cell strings CSTR may include a GIDL transistor GDT, a ground select transistor GST, a string select transistor SST, and/or a plurality of memory cell transistors MCT1 to MCTn, etc., but are not limited thereto. The plurality of memory cell transistors MCT1 to MCTn may be between the ground select transistor GST and the string select transistor SST. The string select transistor SST may be connected to one of the bitlines BL above the memory cells MC in the memory cell string CSTR.

The GIDL transistor GDT may be connected to the common source line CSL below the memory cells MC. The common source line CSL may be commonly connected to sources of the GIDL transistor GDT. According to at least one example embodiment, the GIDL transistor GDT may be connected to the bitline BL above the string select transistor SST.

The string select transistor SST, the plurality of memory cell transistors MCT1 to MCTn, the ground select transistor GST, and the GIDL transistor GDT may be connected in series.

A ground select line GSL, a plurality of wordlines WL1 to WLn, and a plurality of string select lines SSL, and a plurality of GIDL lines GIDL, located between the common source line CSL and the bitlines BL, may be used as gate electrodes of the ground select transistor GST, the memory cell transistors MCT1 to MCTn, the string select transistors SST, and the GIDL transistors GDT, respectively. In addition, each of the memory cell transistors MCT1 to MCTn may include a data storage element.

As an example, a GIDL line GIDL, a ground select line GSL, wordlines WL1 to WL4, and a string select line SSL may be sequentially formed on a substrate, and a mold insulating layer may be below and/or above each of the gate electrode layers. An area of each of the gate electrode layers may be decreased as a distance from the substrate is increased. The bitlines BL may be conductive patterns (for example, metal lines, etc.) spaced apart from the substrate to be included on the substrate.

Referring to FIG. 2 and FIG. 3, the memory cell array may be isolated by a wordline cut region WLC, but is not limited thereto. In addition, the string select line SSL among the gate electrode layers may be isolated by a select line cut region SLC. In some example embodiments, the wordline cut region WLC may be provided as a structure in which one or more insulating materials are gap-filled. For example, such an insulating material may include at least one of a silicon oxide, a silicon nitride, and a silicon oxynitride, etc.

Each of the plurality of channel structures CH may be formed to penetrate through gate electrode layers and/or insulating layers, etc. The number and locations of the channel structures CH are not limited to those illustrated in FIG. 3, and may be variously modified.

In addition, the number of the memory cell strings CSTR, the number of the wordlines WL1 to WLn, the number of the bitlines BL, the number of the ground select lines GSL, the number of the string select lines SSL, and the number of GIDL lines GIDL may vary according to the example embodiments.

A memory cell array according to at least one example embodiment may include GIDL transistors GDT performing an erasing operation of a memory cell array using a GIDL scheme, but is not limited thereto. The GIDL transistors GDT may be between the ground select line GSL and the common source line CSL, and are also referred to as "lower GIDL transistors." In some example embodiments, a plurality of lower GIDL transistors (for example, two or more GIDL transistors, etc.) may also be provided. In some example embodiments, at least one "upper GIDL transistor" may be further included between the string select lines SSL and the bitlines BL, but the example embodiments are no limited thereto.

In at least one example embodiment, lower GIDL transistors may serve as a gate electrode for the generation of at least one hole for an erasing operation. For example, when an erasing voltage is applied to the common source line CSL, and a GIDL voltage is applied to the GIDL line GIDL, a high electric field may be generated in a channel region adjacent to the GIDL transistors GDT by a voltage potential difference between the erasing voltage and the GIDL voltage and holes may be generated in the channel region by the high electric field. The holes, generated in the channel region, may be injected into a memory cell string to perform the erasing operation of a plurality of memory cells.

According to at least one example embodiment, when the erasing voltage is applied to the common source line, an overshoot may intentionally occur wherein a voltage higher than a target voltage is applied for a short time after the erasing voltage reaches the target voltage. For this reason, a lateral field, generated by a voltage potential difference between the erasing voltage and the channel region, may be increased. Accordingly, since the GIDL current is increased, the efficiency of generation of the GIDL current may be increased.

Figure 4:
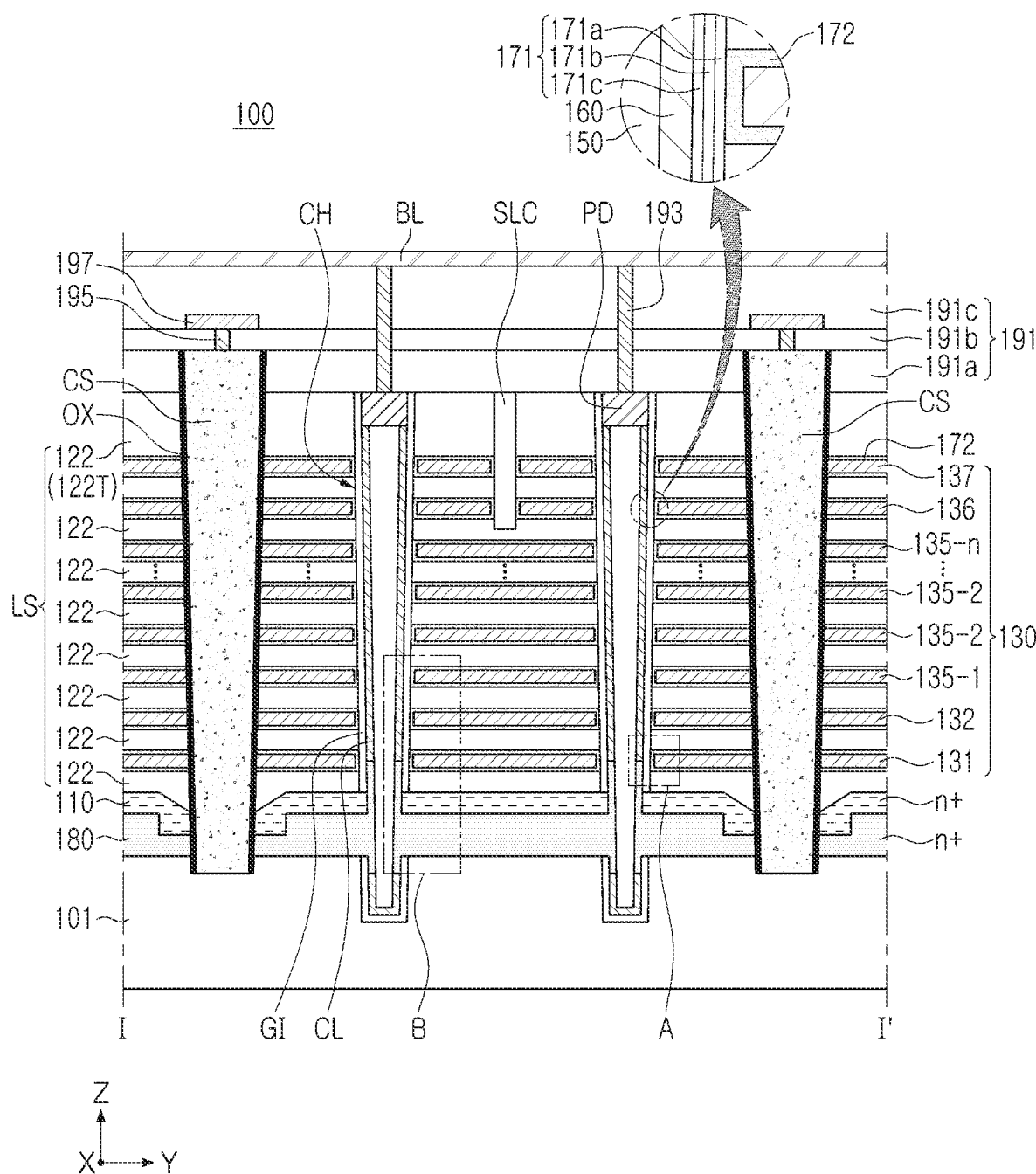
FIG. 4 is a cross-sectional view taken along line I-I' of the three-dimensional semiconductor device illustrated in FIG. 3 according to at least one example embodiment.

FIG. 4 is a cross-sectional view taken along line I-I' of the three-dimensional semiconductor device illustrated in FIG. 3 according to at least one example embodiment.

Referring to FIG. 4, a semiconductor device 100 may include a plurality of substrates, such as substrates 101, 180, and 110, etc., a plurality of channel structures CH, perpendicular to upper surfaces of the plurality of substrates 101, 180, and 110, a plurality of stacked structures LS stacked on the plurality of substrates 101, 180, and 110 to be adjacent to the channel structure CH, and the like. However, the example embodiments are not limited thereto, and other arrangements may be used for the semiconductor device 100. The stacked structure LS may include a plurality of insulating layers 122 and a plurality of gate electrodes 130, etc., the plurality of insulating layers 122 and the plurality of gate electrodes 130 alternately stacked on the plurality of substrates 101, 180, and 110.

The plurality of substrates 101, 180, and 110 of the semiconductor device 100 according to at least one example embodiment may include a first layer 101, a second layer 180, and/or a third layer 110, but is not limited thereto, and may include a greater or lesser number of layers. Each of the first layer 101, the second layer 180, and the third layer 110 may include polysilicon doped with impurities of a first conductivity type, but they are not limited thereto. For example, each of the first layer 101, the second layer 180, and the third layer 110 may be doped with n-type impurities, etc. For the sake of clarity and brevity, it is assumed that the first layer 101 may be a substrate, the second layer 180 may be a source layer, and the third layer 110 may be a support polysilicon layer, but the example embodiments are not limited thereto.

The plurality of gate electrode layers 130 may provide GIDL lines 131 and 137, a ground select line 132, a string select line 136, and a plurality of wordlines 135-1 to 135-n, but are not limited thereto. Each of the GIDL lines 131 and 137, the ground select line 132, and the string select line 136, may provide a GIDL transistor GDT, a ground select transistor GST, and a string select transistor SST, together with the channel structure CH. The plurality of wordlines 135-1 to 135-n may be between the ground select line 132 and the string select line 136, and may provide and/or form a plurality of memory cells, together with the channel structure CH.

The plurality of gate electrode layers 130 may be isolated by a common source line CS and an insulating layer OX surrounding side surfaces of the common source line CS, but is not limited thereto. The common source line CS may be formed of a conductive material such as a metal, a metal compound, and/or polysilicon, etc. The common source line CS may be electrically isolated from the plurality of gate electrode layers 130 by the insulating layer OX. A lower portion of the common source line CS, in contact with the substrate 101, may be exposed to the substrate 101 as it is. Thus, the common source line CS may be electrically connected to the source layer 180 and the support polysilicon layer 110, formed on the substrate 101, through the substrate 101. The common source line CS and the insulating layer OX may be provided in the wordline cut region, but is not limited thereto.

According to at least one example embodiment, the plurality of insulating layers 122 may include at least one of a silicon layer, a silicon oxide layer, a silicon carbide layer, a silicon oxynitride layer, and/or a silicon nitride layer, etc. The plurality of gate electrodes 130 may include a metal such as polysilicon or tungsten (W) and/or a conductive metal nitride, but is not limited thereto.

The stacked structure LS may include channel holes formed in a third direction Z perpendicular to an upper surface of the substrate 101. Channel structures CH may be provided in the channel holes. The channel structure CH may include a vertical channel layer 160 penetrating through the stacked structure LS, a buried insulating layer 150 filling a space in the vertical channel layer 160, and a vertical insulating layer 171 between the vertical channel layer 160 and a plurality of gate electrodes 130, etc.

The channel structure CH may penetrate through (e.g., pass through, etc.) the stacked structure LS to be electrically connected to the source layer 180 and the support polysilicon layer 110, formed on the substrate 101, through the substrate 101. A plurality of channel structures CH may be provided in the stacked structure LS, and the plurality of channel structures CH may be arranged in the first direction X and second direction Y, but the example embodiments are not limited thereto. The plurality of channel structures may be arranged in a zigzag pattern, as illustrated in FIG. 3, or in other patterns.

The vertical channel layer 160 may have a pillar shape, such as cylindrical shape or a prismatic shape, having no buried insulating layer 150 according to at least one example embodiment, but the example embodiments are not limited thereto. In addition, the channel structure CH may have a sloped side surface narrowed in a direction toward the substrate 101 depending on (and/or based on) an aspect ratio thereof. The vertical channel layer 160 may include a semiconductor material, such as polysilicon or single crystal silicon, etc., and the semiconductor material may be an undoped material, but is not limited thereto.

The vertical insulating layer 171 may include a tunnel insulating layer 171c, a charge storage layer 171b, and/or a blocking layer 171a, etc., but is not limited thereto. At least a portion of the blocking layer 171a may be formed in a shape surrounding the plurality of gate electrodes 130 to be provided as a blocking layer 172, but the example embodiments are not limited thereto.

According to at least one example embodiment, the tunnel insulating layer 171c may be interposed between the charge storage layer 171b and the vertical channel layers 160, and the blocking insulating layer 171a may be interposed between the charge storage layer 171b and the gate electrodes 130, but the example embodiments are not limited thereto. For example, the charge storage layer 171b may include at least one of a silicon nitride layer, a silicon oxynitride layer, a silicon-rich nitride layer, a nanocrystalline silicon layer, and a stacked trap layer, etc. The tunnel insulating layer 171c may include a material having an energy band gap greater than an energy band gap of the charge storage layer 171b. As an example, the tunnel insulating layer 171c may be a silicon oxide layer, etc. The blocking layer 171a may include a material having an energy bandgap greater than an energy bandgap of the charge storage layer 171b. As an example, the blocking layer 171a may be a silicon oxide layer, a silicon nitride layer, and/or a silicon oxynitride layer, etc.

Bitlines BL may be on the stacked structure LS to cross over an upper surface of the stacked structure LS. The bitlines BL may be connected to the pad PD, the pad PD on (and/or included on) an upper end of the channel structure CS, through a first contact via 193. An interlayer dielectric 191 may be provided between the bitlines BL and the stacked structure LS, and the first contact via 193 may be formed to penetrate through the interlayer dielectric 191, but the example embodiments are not limited thereto. The interlayer dielectric 191 may include a first insulating layer 191a on the stacked structure LS to cover a pad PD of the channel structure CS, and a second insulating layer 191b and a third insulating layer 191c on in the first insulating layer 191a to cover the channel structure CH, but the example embodiments are not limited thereto.

The common source line CS may penetrate through (e.g., pass through, etc.) the first insulating layer 191a, and a second contact via 195 may be formed on an upper end of the common source line CS to penetrate through the second insulating layer 191b, but the example embodiments are not limited thereto. The common source line CS may be applied with an erasing voltage through a terminal 197 formed on the second insulating layer 191b.

The semiconductor device 100 may apply a ground voltage to a wordline and an erasing voltage (e.g., a voltage corresponding to an erase operation) to the common source line CS during an erasing operation. In this case, a wordline voltage may be coupled to the vertical channel layer 160 with the insulating layer 171 interposed therebetween. Due to a coupling effect, the same ground voltage as the wordline voltage may be applied to the vertical channel layer 160 adjacent to the wordline.

The semiconductor device 100 according to at least one example embodiment may cause an overshoot (e.g., a voltage overshoot) to intentionally occur by applying a voltage higher than a target voltage for a short time after an erasing voltage, applied through the common source line CS, reaches the target voltage. The short time period for the overshoot may be relative to and/or in comparison to the time period for applying the erase voltage of the erase operation and/or voltages of other input/output operations (e.g., read operation, write operation, etc.) of the semiconductor device, for example, the time period of the overshoot may be less than the time period for applying the erase voltage of the erase operation or voltages of other input/output operations of the semiconductor device. Accordingly, a lateral field, generated by a potential difference (e.g., voltage difference) between the erasing voltage and a voltage applied to the vertical channel layer 160, may be increased. Thus, a hole migrating from the source layer 180 to the vertical channel layer 160 may migrate more rapidly, and an absolute amount of the hole migrating from the source layer 180 to the vertical channel layer 160 may be increased. Accordingly, a GIDL current may be increased to decrease the erasing voltage. As a result, since electrical stress of the vertical insulating layer 171 may be reduced, the lifespan of a semiconductor device and/or product may be increased.

Figure 5A:
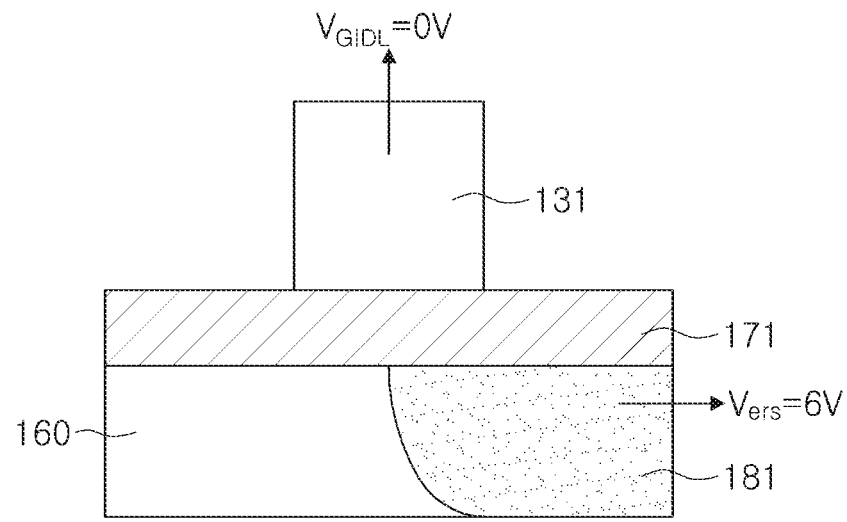
FIGS. 5A and 5B are an enlarged cross-sectional view of region "A" in FIG. 4 according to at least one example embodiment.
Figure 5B:
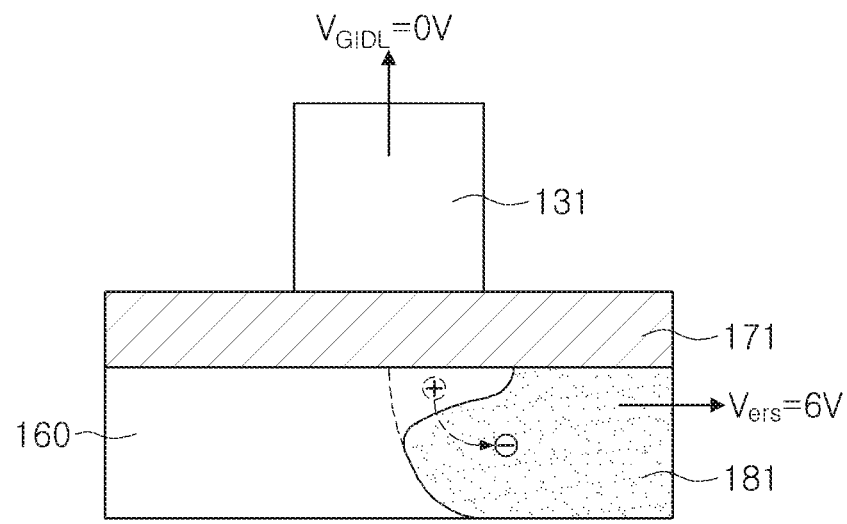

FIGS. 5A and 5B are an enlarged cross-sectional view of region "A" in FIG. 4 according to at least one example embodiment.

Referring to FIG. 5A, at least one common source extension region 181, in which a source layer 180 extends along a vertical channel layer 160, may be formed in a semiconductor device. For example, the common source extension region 181 may be formed to overlap a portion of the GIDL line 131, but is not limited thereto.

For ease of description and the sake of clarity, it will be assumed that a GIDL voltage (for example, $V_{GIDL}$=0V) is applied to the GIDL line 131 and an erasing voltage (for example, $V_{ers}$=6V) is applied to the source layer 180, but the example embodiments are not limited thereto. The erasing voltage $V_{ers}$, applied to the source layer 180, may also be applied to the common source extension region 181. Thus, a potential difference (e.g., voltage difference) may occur between the GIDL line 131 and the common source extension region 181.

Referring to FIG. 5B, a potential difference may occur in the insulating layer 171 in which the common source extension region 181 and the GIDL line 131 overlap each other. The potential difference may correspond to the potential difference occurring between the GIDL line 131 and the common source extension region 181, but is not limited thereto. Due to the potential difference occurring in the insulating layer 171, a band-to-band tunneling effect may occur in a junction surface of the vertical channel layer 160 and the common source extension region 181.

Electrons of the vertical channel layer 160, the vertical channel layer 160 included in the vicinity of the common source extension region 181, may migrate to the common source extension region 181 due to the band-to-band channel effect. Holes may be formed in a location in which the holes, migrating to the common source extension region 181, were present. Accordingly, an electrically isolated region may be formed in the vertical channel layer 160, overlapping the GIDL line 131, in which holes are generated. The electrically isolated region may accumulate generated holes or release the accumulated holes.

Figure 6:
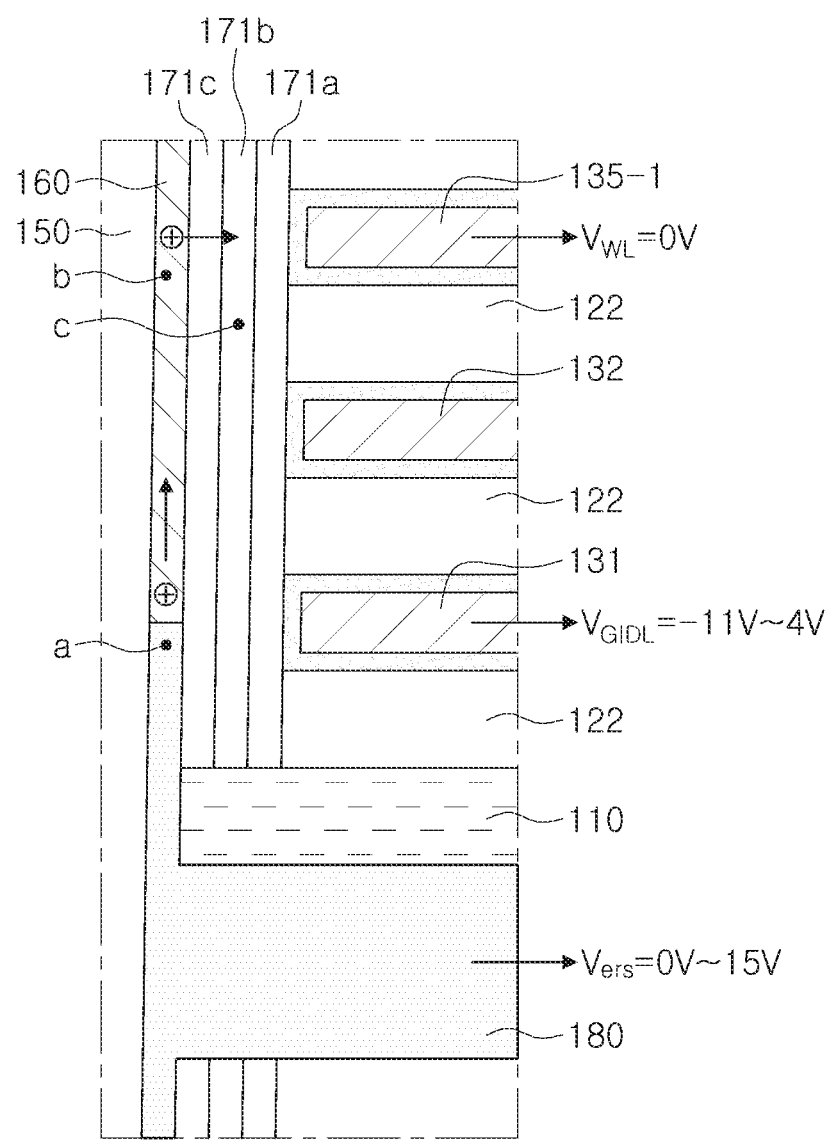
FIG. 6 is an enlarged cross-sectional view of region "B" in FIG. 4 according to at least one example embodiment.

FIG. 6 is an enlarged cross-sectional view of region "B" in FIG. 4, and FIGS. 7 to 9 are graphs illustrating waveforms of an erasing voltage and a GIDL current according to at least one example embodiment.

Referring to FIG. 6, an erasing voltage $V_{ers}$ may be applied to the source layer 180 during an erasing operation of the semiconductor device, but the example embodiments are not limited thereto. For example, a target voltage (e.g., a desired voltage) of the erasing voltage $V_{ers}$ may be 15V, but is not limited thereto and may be set to any appropriate voltage for performing an erase operation on a desired semiconductor device. During the erasing operation of the semiconductor device, a GIDL voltage $V_{GIDL}$ may be applied to a GIDL line 131. The GIDL voltage $V_{GIDL}$ may be applied while maintaining a constant and/or near constant potential difference with the erasing voltage $V_{ers}$, but the example embodiments are not limited thereto, and the potential difference between $V_{GIDL}$ and $V_{ers}$ may vary during the step-up period according to at least one example embodiment. In other words, the GIDL voltage $V_{GIDL}$ may have a same rate of change as the erasing voltage $V_{ers}$. During the erasing operation of the semiconductor device, a wordline voltage $V_{WL}$ may be applied to a wordline 135-1. For example, the wordline voltage $V_{WL}$ may be 0V, but the example embodiments are not limited thereto.

Figure 7:
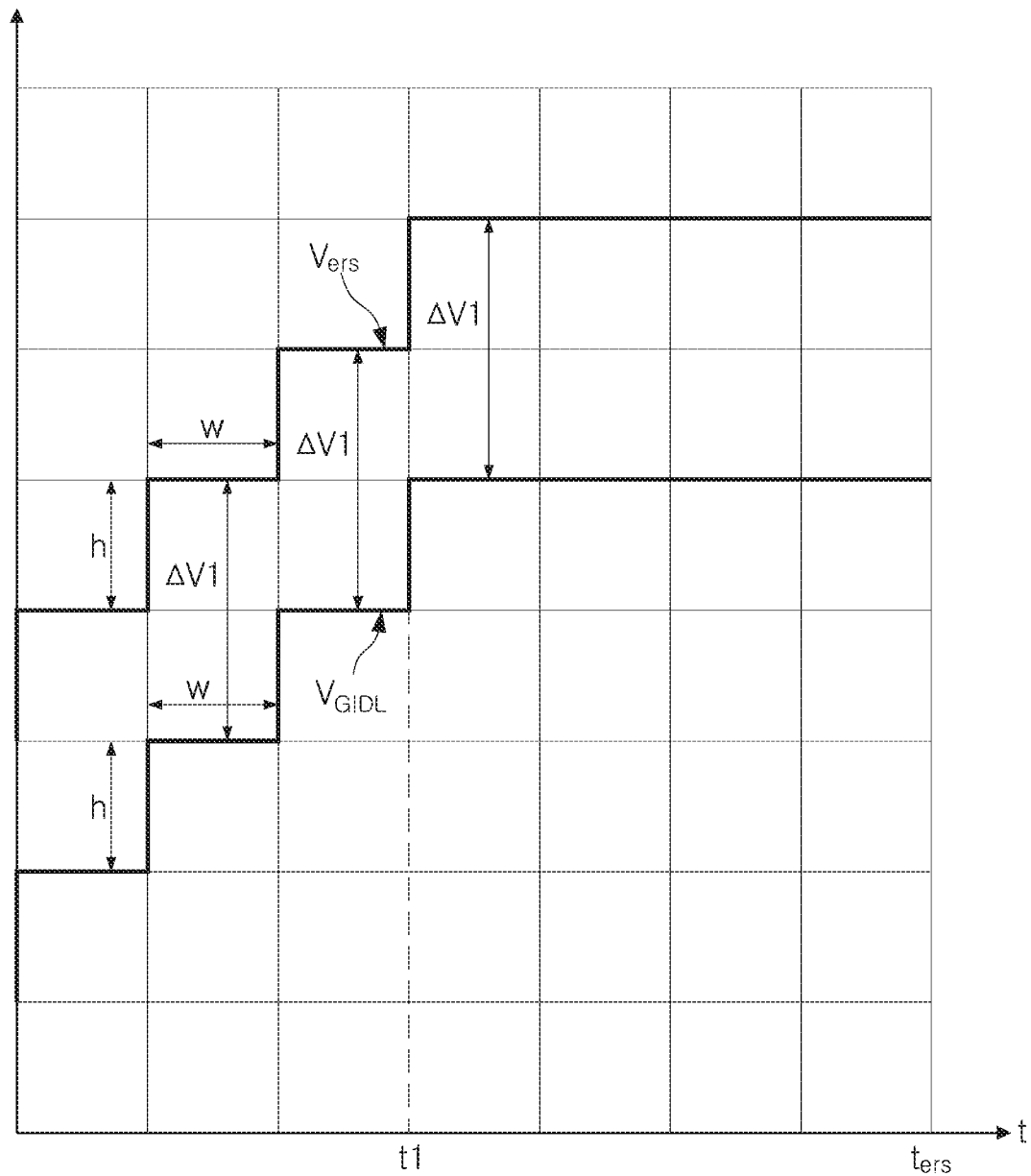
FIGS. 7 to 9 are graphs illustrating waveforms of an erasing voltage and a GIDL current according to at least one example embodiment.

Referring to FIGS. 6 and 7, according to at least one example embodiment, when the erasing voltage $V_{ers}$ is stepped up (e.g., increased) until the erasing voltage $V_{ers}$ reaches the target voltage, the GIDL voltage $V_{GIDL}$ may be stepped up while maintaining a constant (and/or near constant) potential difference with the erasing voltage $V_{ers}$. In other words, the voltage of the GIDL voltage $V_{GIDL}$ may be increased at the same rate as the voltage of the erasing voltage $V_{ers}$. The magnitude and pulse width of a unit step voltage of the erasing voltage $V_{ers}$ may be the same as those of a unit step voltage of the GIDL voltage $V_{GIDL}$, respectively. For example, when the erasing voltage $V_{ers}$ is stepped up from 0V to 15V until the erasing voltage $V_{ers}$ reaches the target voltage, the GIDL voltage $V_{GIDL}$ may be stepped up from −11V to 4V, but the example embodiments are not limited thereto. Accordingly, the GIDL voltage $V_{GIDL}$ may maintain a constant (and/or near constant) potential difference ΔV1 from the erasing voltage $V_{ers}$ during the erasing operation of the semiconductor device.

Figure 8:
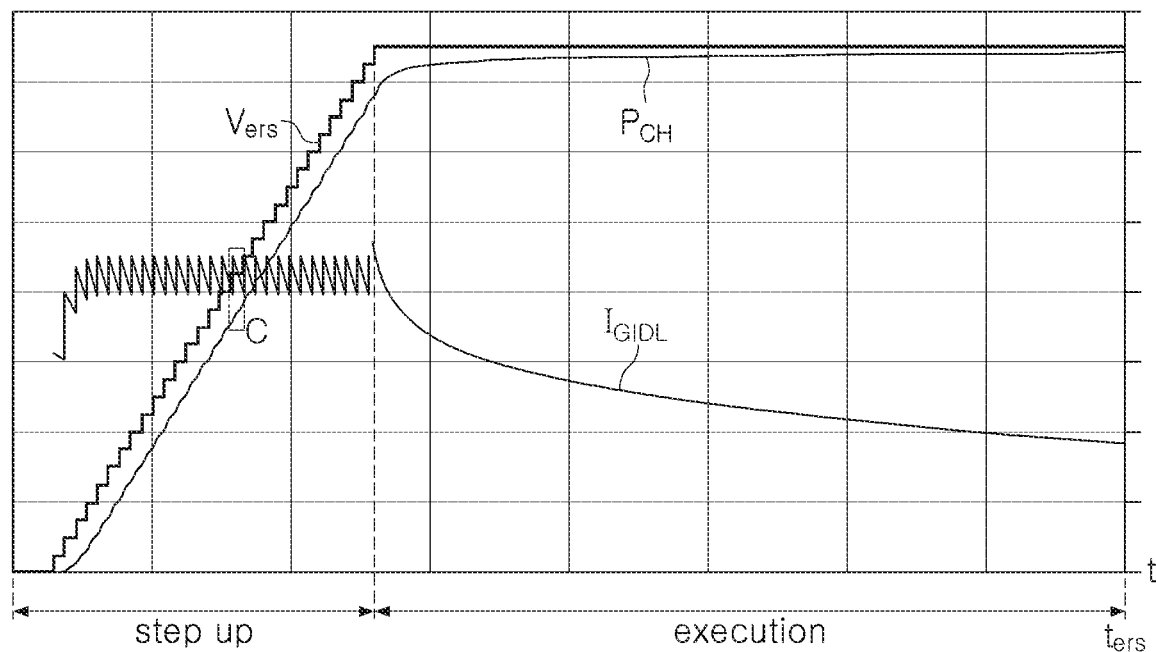

Referring to FIGS. 6 and 8, entire erasing time $t_{ers}$ of the semiconductor device may include a step-up period and an execution period. An erasing voltage (for example, $V_{ers}$=0 to 15V, etc.) may be applied to the source layer 180 during the step-up period (e.g., the time period the step-up voltage is applied). As illustrated in FIG. 7, the erasing voltage $V_{ers}$ may be a step voltage. For example, an increase of the step voltage may be 0.5V, but is not limited thereto. The semiconductor device may step up (and/or increase) the erasing voltage $V_{ers}$ until the erasing voltage $V_{ers}$ reaches a target voltage (for example, 15V) from 0V, but the example embodiments are not limited thereto.

Returning to FIG. 6, a GIDL voltage (for example, $V_{GIDL}$=−11V to 4V) may be applied to the GIDL line 131 during the step-up period. For example, the GIDL voltage $V_{GIDL}$ may have a potential lower than the erasing voltage $V_{ers}$ by a first voltage (for example, 11V, etc.). For example, when the erasing voltage $V_{ers}$ is stepped up (e.g., increased) until the erasing voltage reaches the target voltage, the GIDL voltage $V_{GIDL}$ may be stepped up (e.g., increased) while maintaining a constant (and/or near constant) potential difference (for example, 11 V) with the erasing voltage $V_{ers}$. Thus, a first potential difference (for example, 11V) may occur between the GIDL line 131 and the source layer 180, but is not limited thereto.

When a first potential difference occurs between the GIDL line 131 and the source layer 180, a band-to-band tunneling effect may occur on a junction surface of the vertical channel layer 160 and the common source extension region "a," as described with reference to FIG. 5.

Electrons in the vertical channel layer 160 included in the vicinity of the common source extension region "a," may migrate to the common source extension region "a" due to the band-to-band tunneling effect. Holes (+) may be generated in a location in which the electrons, migrating to the common source extension region, were present. According to at least one example embodiment, an isolated region may be formed in a portion of the vertical channel layer 160 overlapping the GIDL line 131. Holes (+) may be accumulated in the isolated region. As the first potential difference between the GIDL line 131 and the source layer 180 is increased, an absolute amount of the holes (+) accumulated in the isolated region may be increased.

A wordline voltage (for example, $V_{WL}$=0V) may be applied to the wordline 135-1 during the step-up period. Since the string select transistor is in a turned-off state, the vertical channel layer 160 may be in a floating state. In this case, the wordline voltage VWL may be coupled to the vertical channel layer 160 with the insulating layer 171 interposed therebetween. Due to the coupling effect, the same voltage as the wordline voltage VWL may be applied to a vertical channel layer "b" adjacent to the wordline 135-1. Accordingly, a second potential difference (for example, 0V to 15V) may occur between the common source extension region "a" and the vertical channel layer "b" adjacent to the wordline 135-1, but the example embodiments are not limited thereto.

When a second potential difference occurs between the common source extension region "a" and the vertical channel layer "b" adjacent to the wordline 135-1, the holes (+), accumulated in the isolated region, may migrate to the wordline 135-1 along the vertical channel layer 160.

As an example, the erasing voltage $V_{ers}$ may be stepped up (e.g., increased, incrementally increased, and/or gradually increased, etc.) during the step-up period (e.g., during a voltage increasing period) until the erasing voltage $V_{ers}$ reaches a target voltage (for example, 15 V) from 0V. Thus, the second potential difference, occurring between the common source extension region "a" and the vertical channel layer "b" adjacent to the wordline 135-1, may be gradually increased from an initial voltage (e.g., 0V) to the target voltage (e.g., 15V), but is not limited thereto.

The greater the second potential difference between the common source extension region "a" and the vertical channel layer "b" adjacent to the wordline 135-1, the faster the holes may migrate to the wordline 135-1 from the isolated region.

During the execution period, the holes (+) of the vertical channel layer "b" adjacent to the wordline 135-1 may migrate to the charge storage layer 171b adjacent to the wordline 135-1. When the execution period starts, a third potential difference may occur between the vertical channel layer "b" and the charge storage layer 171b, each adjacent to the wordline 135-1.

Figure 9:
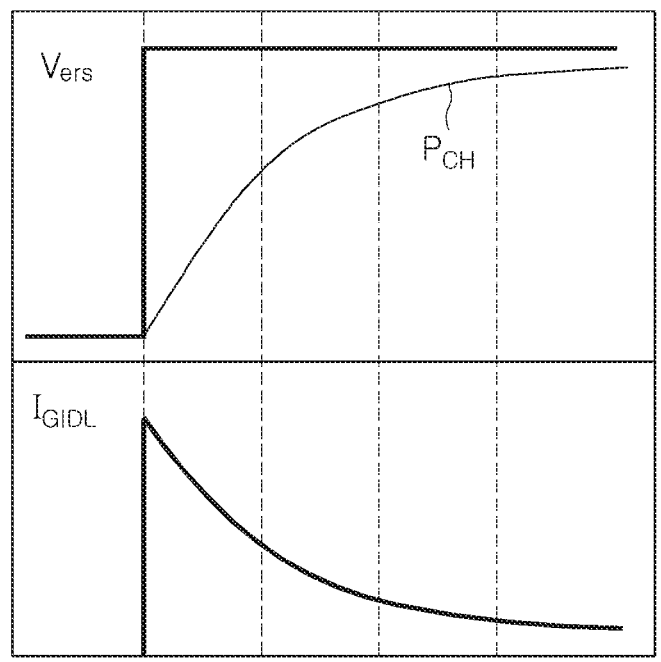

FIG. 9 is an enlarged view of region "C" in FIG. 8 according to at least one example embodiment.

Referring to FIG. 9, when the erasing voltage $V_{ers}$ increases from, for example, 0V to 0.5V, during a step-up period, a second potential difference may occur between a common source extension region "a" and a vertical channel layer "b" adjacent to the wordline 135-1. Holes, accumulated in an isolated region, may migrate to the wordline 135-1 along the vertical channel layer 160 due to the second potential difference.

As the second potential difference occurs, a channel potential $P_{CH}$ of the vertical channel layer 160 may be increased rapidly. Then, as holes (+), accumulated in the isolated region, migrate to the wordline 135-1, the channel potential $P_{CH}$ of the vertical channel layer 160 may be increased slowly. Thus, a gap between the channel potential $P_{CH}$ and the erasing voltage $V_{ers}$ may be gradually decreased, and a GIDL current, generated by the migration of the holes, may be increased in a moment and then be decreased exponentially.

Figure 10:
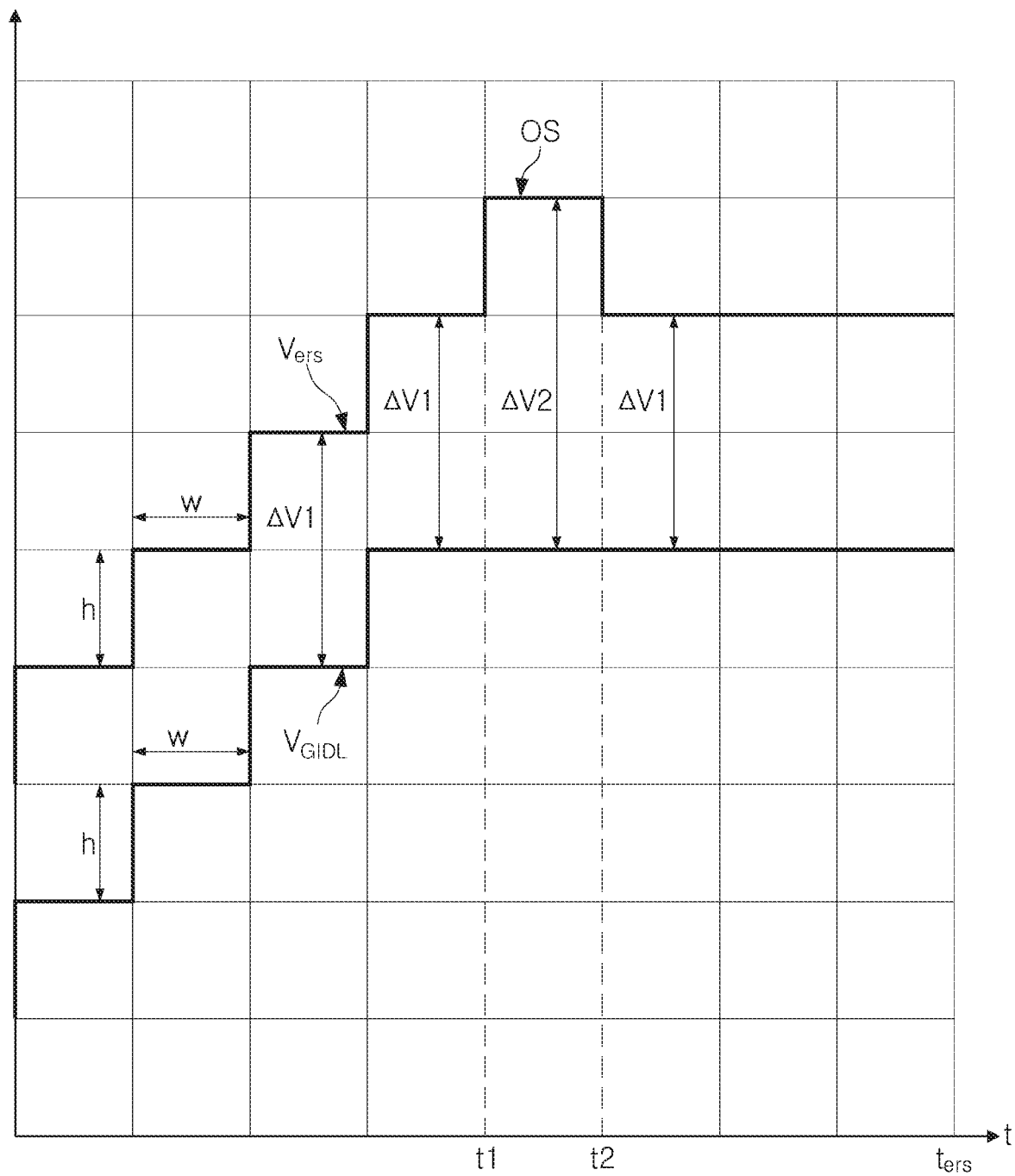
FIGS. 10 and 11 are graphs illustrating waveforms of an erasing voltage and a GIDL current according to at least one example embodiment.
Figure 11:
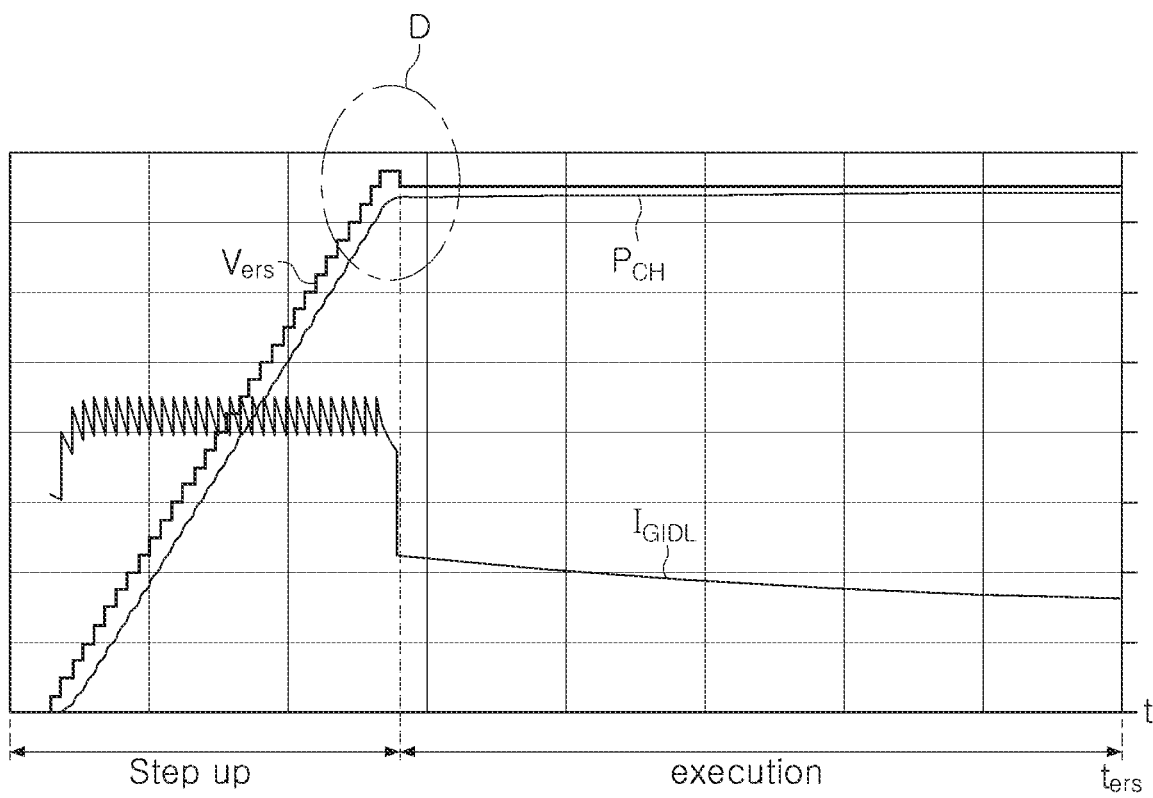
Figure 12:
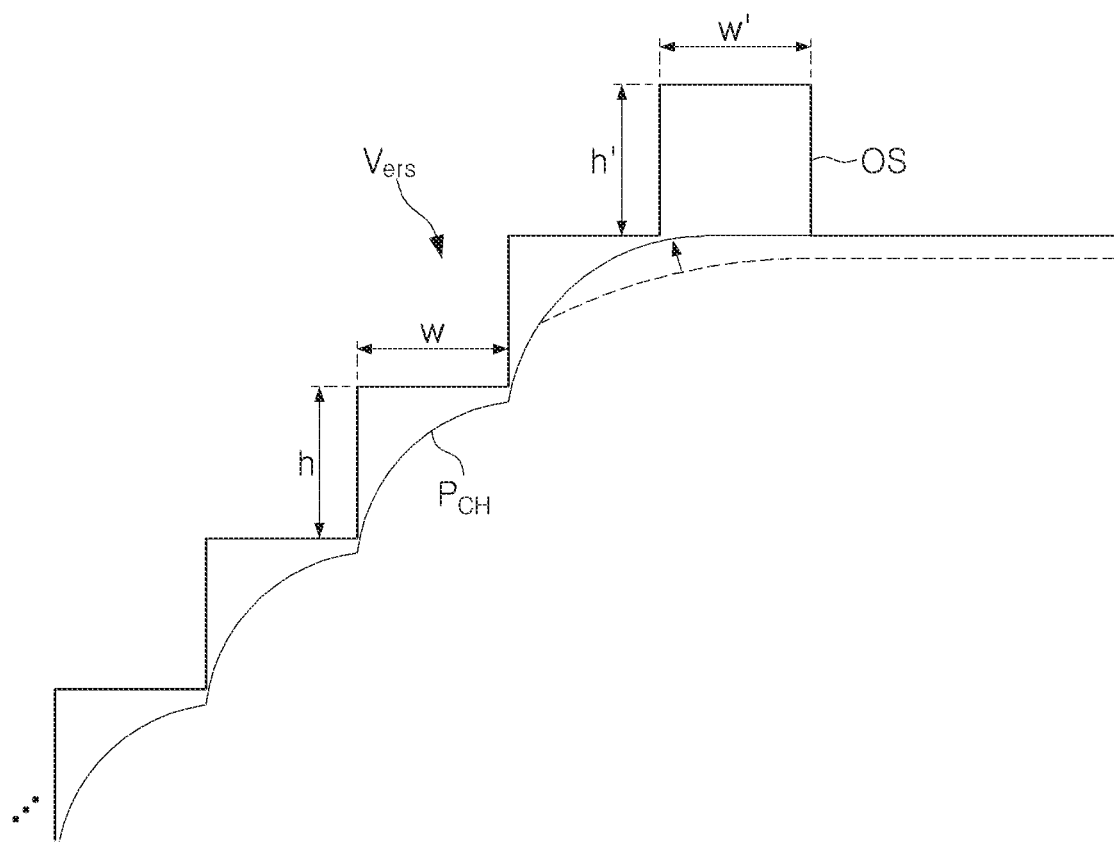
FIG. 12 is an enlarged view of region "D" in FIG. 10 according to at least one example embodiment.

FIGS. 10 and 11 are graphs illustrating waveforms of an erasing voltage and a GIDL current according to at least one example embodiment, and FIG. 12 is an enlarged view of region "D" in FIG. 10 according to at least one example embodiment.

An erasing voltage $V_{ers}$ of FIGS. 10 to 12 is different from the erasing voltage $V_{ers}$ of FIGS. 7 to 9. After the erasing voltage $V_{ers}$, applied to a source layer 180 during a step-up period, reaches a target voltage (for example, 15V), overshoot may intentionally occur by applying a voltage higher than the target voltage for a short time.

In this specification, the term "overshoot" may refer to a phenomenon where after an erasing voltage $V_{ers}$ reaches a target voltage (for example, 15V), a unit step voltage is intentionally additionally applied, such that the erasing voltage $V_{ers}$ has a voltage higher than the target voltage, and after the unit step voltage is additionally applied, the erasing voltage $V_{ers}$ is intentionally stepped down to the target voltage.

According to at least one example embodiment, when an erasing voltage $V_{ers}$ is stepped down after a unit step voltage is intentionally additionally applied, the stepped-down erasing voltage $V_{ers}$ may be higher than a target voltage. According to at least one example embodiment, when an erasing voltage $V_{ers}$ is stepped down after a unit step voltage is intentionally additionally applied, the stepped-down erasing voltage $V_{ers}$ may be lower than the target voltage.

Referring to FIG. 10, when an erasing voltage $V_{ers}$ is stepped up for a time t1 until the erasing voltage $V_{ers}$ reaches a target voltage, a GIDL voltage $V_{GIDL}$ may be stepped up while maintaining a constant (and/or near constant) potential difference with the erasing voltage $V_{ers}$. The magnitude and pulse width of the unit step voltage of the erasing voltage $V_{ers}$ may be the same as those of the unit step voltage of the GIDL voltage $V_{GIDL}$, respectively. For example, when the erasing voltage $V_{ers}$ is stepped up from 0V to 15V until the erasing voltage $V_{ers}$ reaches a target voltage, the GIDL voltage $V_{GIDL}$ may be stepped up from −11V to 4V, but the example embodiments are not limited thereto. Accordingly, the GIDL voltage $V_{GIDL}$ may maintain a constant (and/or near constant) potential difference ΔV1 from the erasing voltage $V_{ers}$ for the time t1.

After the erasing voltage $V_{ers}$ reaches the target voltage (for example, 15 V) for a time t1 to t2, the unit step voltage OS may be intentionally additionally is applied such that the erasing voltage $V_{ers}$ has a higher level than the target voltage. After the unit step voltage OS is further intentionally applied, the erasing voltage $V_{ers}$ may be intentionally stepped down to the target voltage. The GIDL voltage $V_{GIDL}$ may not be stepped up along the erasing voltage $V_{ers}$ and may maintain a voltage at the time t1. Thus, the GIDL voltage $V_{GIDL}$ may maintain a constant (and/or near constant) potential difference ΔV2 from the erasing voltage $V_{ers}$ for the time t1 to t2. The potential difference ΔV2, maintained for the time t1 to t2 time, may be greater than the potential difference ΔV1 maintained for the time t1.

After the time t2, the erasing voltage $V_{ers}$, stepped down to the target voltage, may maintain the target voltage. Since the GIDL voltage $V_{GIDL}$ may maintain a constant (and/or near constant) voltage after the time t1, the GIDL voltage $V_{GIDL}$ may maintain the constant (and/or near constant) potential difference ΔV1 from the erasing voltage $V_{ers}$ after the time t2. During the erasing operation a desired upper and/or maximum magnitude of the erasing voltage $V_{ers}$ may be greater than the magnitude of the erasing voltage $V_{ers}$ maintained after the time t2.

According to at least one example embodiment, since the potential difference maintained for the time t1 to t2 is increased, an absolute amount of the holes (+) accumulated in the isolated region may be increased. In addition, since the speed at which electrons of the vertical channel layer migrates to the common source extension region is increased, the holes (+) may be accumulated in an isolated region more rapidly.

Referring to FIG. 11, an entire erasing time $t_{ers}$ of the semiconductor device may include a step-up period and an execution period. During the step-up period, an erasing voltage (for example, $V_{ers}$=0 to 15V) may be applied to the source layer. The erasing voltage $V_{ers}$ may be stepped up until the erasing voltage $V_{ers}$ reaches a target voltage (for example, 15V) from an initial voltage (for example, 0V).

Even after the erasing voltage $V_{ers}$ reaches the target voltage (for example, 15V), the erasing voltage $V_{ers}$ may be additionally stepped up N times (N being an integer greater than or equal to 1) to have a voltage (for example, 15V+N) higher than the target voltage (for example, 15V), but the example embodiments are not limited thereto. After the erasing voltage $V_{ers}$ is additionally stepped up N times, the erasing voltage $V_{ers}$ may be stepped down again to the target voltage (for example, 15V).

According to at least one example embodiment, the semiconductor device may step up the erasing voltage $V_{ers}$ until the erasing voltage $V_{ers}$ reaches a target voltage (for example, 15V) from an initial voltage (for example, 0V). The absolute amount of the holes (+), accumulated in the isolated region, may be increased by overshoot occurring after the erasing voltage $V_{ers}$ reaches the target voltage. Thus, the erasing voltage may be decreased even when the same GIDL current is generated and the electrical stress applied to the insulating material may be reduced. As a result, the lifespan of a semiconductor device and/or product may be increased.

In addition, the overshoot, occurring after the erasing voltage $V_{ers}$ reaches the target voltage, may increase the speed at which electrons of the vertical channel layer migrate to the common source extension region. Accordingly, holes (+) may be accumulated in the isolated region more rapidly. As a result, the erasing time may be reduced even if the same erasing voltage (e.g., the same magnitude erasing voltage) is applied.

Referring to FIGS. 11 and 12, after the erasing voltage $V_{ers}$ reaches a target voltage (for example, 15 V), the unit step voltage may be additionally applied, such that the erasing voltage $V_{ers}$ has a higher level than the target voltage. After the unit step voltage is additionally applied, the erasing voltage $V_{ers}$ may be stepped down again to the target voltage. When the overshoot OS (e.g., overshoot voltage) is present in the erasing voltage $V_{ers}$, the channel potential PCH may be increased more rapidly than when the overshoot OS is not present. Thus, the channel potential PCH may rapidly follow the erasing voltage $V_{ers}$.

According to at least one example embodiment, a pulse width w' of the additionally applied unit step voltage OS may be the same as a pulse width w of a unit step voltage of the erasing voltage $V_{ers}$, but the example embodiments are not limited thereto. According to at least one example embodiment, the magnitude h' of the additionally applied unit step voltage OS may be the same as the magnitude h of the unit step voltage of the erasing voltage $V_{ers}$, but the example embodiments are not limited thereto.

According to at least one example embodiment, a pulse width w' of the additionally applied unit step voltage OS may be different from a pulse width w of the unit step voltage of the erasing voltage $V_{ers}$. According to at least one example embodiment, the magnitude h' of the additionally applied unit step voltage OS may be different from the magnitude h of the unit step voltage of the erasing voltage $V_{ers}$.

For example, the pulse width w' of the additionally applied unit step voltage OS may be a desired percentage less (e.g., 10% or less) of a total erasing time $t_{ers}$, and the magnitude of the additionally applied unit step voltage OS h' may be a desired percentage less (e.g., 10% or less) of the target erasing voltage (for example, 15V), but the example embodiments are not limited thereto.

The semiconductor device according to at least one example embodiment may include an erasing voltage generator configured to apply an erasing voltage $V_{ers}$ to a memory cell array. The erasing voltage generator may be included in the memory controller 30 according to at least one example embodiment, but is not limited thereto. The semiconductor device may further include an additional circuit, e.g., an overshoot voltage generator, for implementing and/or generating an overshoot to apply a voltage higher than a target voltage to the erasing voltage $V_{ers}$ for a short time. According to at least one example embodiment, the overshoot voltage generator may be included in the memory controller 30, but is not limited thereto. As an example, the semiconductor device may further include a capacitor additionally connected to the erasing voltage generator to supply the overshoot voltage, but is not limited thereto. As the voltage is charged and discharged in the capacitor, the erasing voltage $V_{ers}$ may be further stepped up N times, and then may be stepped down again to the target voltage. However, according to some example embodiments, the erasing voltage generator may generate and supply the overshoot voltage as well. Thus, the voltage generator 35 included in the memory controller 30, may includes the erasing voltage generator and the additional circuit for implementing and/or generating the overshoot.

In the semiconductor device according to at least one example embodiment, when the erasing voltage $V_{ers}$ is applied to the memory cell array, a DC pulse may be applied for a short time even after the erasing voltage $V_{ers}$ reaches the target voltage. Thus, the erasing voltage $V_{ers}$ may be further stepped up N times, and then may be stepped down again to the target voltage.

Figure 13:
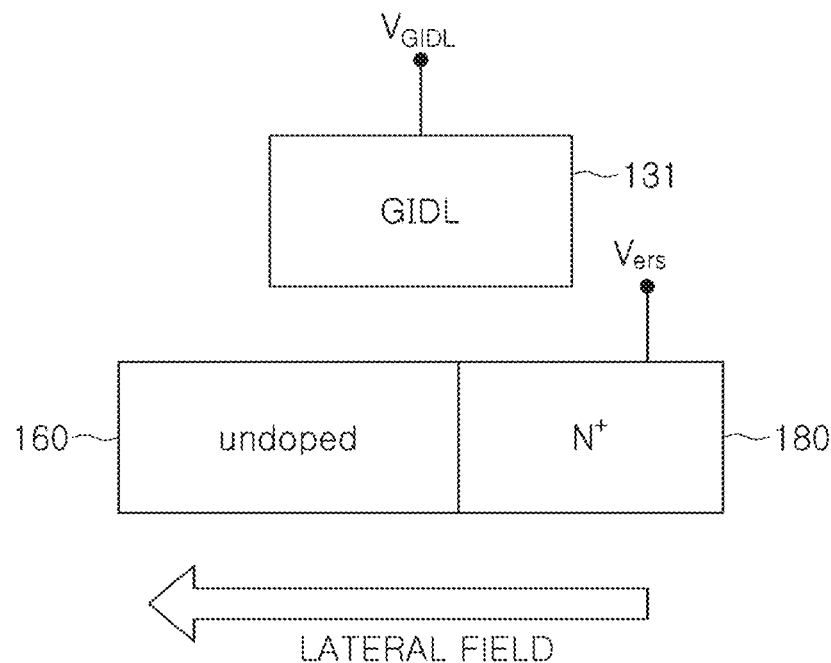
FIG. 13 illustrates a semiconductor device according to at least one example embodiment.

FIG. 13 illustrates a semiconductor device according to at least one example embodiment.

Referring to FIG. 13, a semiconductor device may include a vertical channel layer 160, a source layer 180, and/or a GIDL line 131, etc., but is not limited thereto.

The vertical channel layer 160 may include an undoped semiconductor material, etc. The source layer 180 may be a source region of a first conductivity type. For example, the first conductivity type may be an N type, but is not limited thereto. The source layer 180 may be a common source extension region in which a source region of the first conductivity type, formed on a substrate, extends along the vertical channel layer 160, but is not limited thereto. The GIDL line 131 may provide at least one GIDL transistor.

During an erasing operation of the semiconductor device, a GIDL voltage (for example, $V_{GIDL}=-11V$ to 4V) may be generated by the voltage generator 35, or a separate GIDL voltage generator (not shown), and the GIDL voltage may be applied to the GIDL line 131, and an erasing voltage (for example, $V_{ers}=0V$ to 15V) may be applied to the source layer 180. The erasing operation of the semiconductor device may include a step-up period and an execution period. The erasing voltage (for example, $V_{ers}=0$ to 15V) may be applied to the source layer 180 during the step-up period.

When the erasing voltage $V_{ers}$ is applied to the source layer 180 during the step-up period, there may be an overshoot operation to apply a voltage higher than a target voltage (for example, 15V) for a desired overshoot period (e.g., an overshoot time and/or a short time, etc.). Accordingly, the erasing voltage $V_{ers}$ may be increased to be higher than the target voltage (for example, 15V) during the overshoot period. As a result, a lateral field, generated by a potential difference between the erasing voltage $V_{ers}$ applied to the source layer 180 and the voltage (for example, 0V) applied to the vertical channel layer 160, may be increased.

According to at least one example embodiment, holes (+) may be accumulated in an isolated region of the vertical channel layer 160 by a first potential difference occurring between the GIDL line 131 and the source layer 180. When a lateral field between the source layer 180 and the vertical channel layer 160 increases, an absolute amount of the holes (+), accumulated in the isolated region, may be increased. In addition, when the lateral field between the source layer 180 and the vertical channel layer 160 is increased, the holes (+) may be accumulated in the isolated region more rapidly.

A vertical field between the GIDL line 131 and the vertical channel layer 160 is increased to induce generation of a GIDL current. However, in order to increase the vertical field in conventional semiconductor devices, a voltage applied to the GIDL line 131 is increased, which causes an insulating material between the GIDL line 131 and the vertical channel layer 160 to be deteriorated and/or become deteriorated.

However, the semiconductor devices according to one or more of the example embodiments may introduce an overshoot period in which a voltage higher than a target voltage is applied for a short time to an erasing voltage $V_{ers}$ applied to the source layer 180, and then is stepped down again to the target voltage. Accordingly, the efficiency of the generation of the GIDL current may be improved without causing the insulating material between the GIDL line 131 and the vertical channel layer 160 to become deteriorated.

Since the erasing voltage may be decreased when the GIDL current is increased, the electrical stress applied to the insulating material may be reduced. Thus, the lifespan of a semiconductor device and/or product may be increased. In addition, an erasing time (e.g., the time to perform an erasing operation) may be reduced even if the same magnitude erasing voltage is applied.

Figure 14:
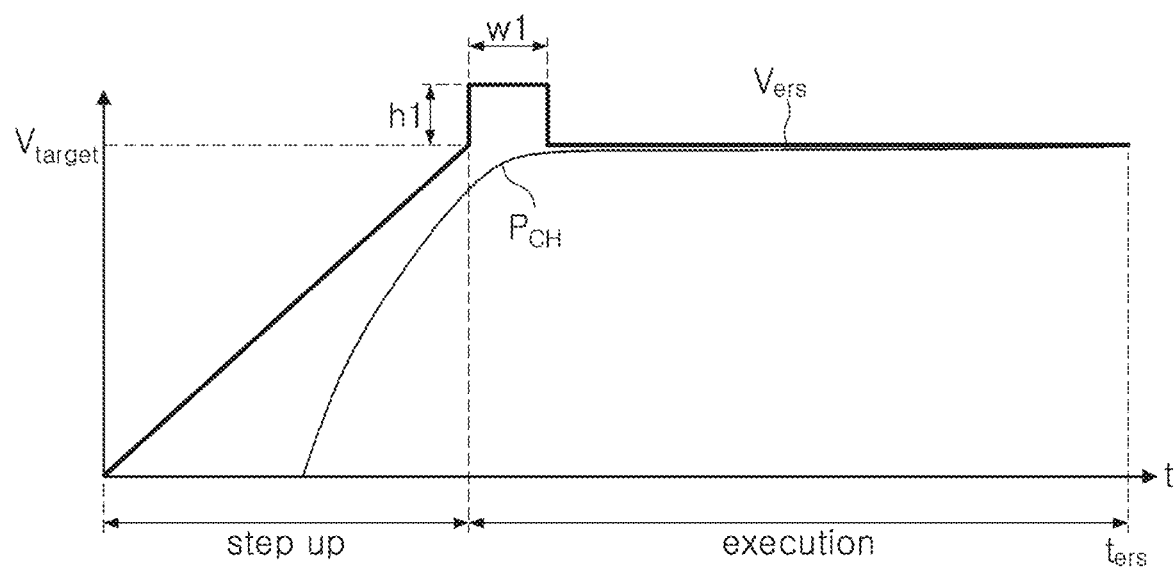
FIGS. 14 and 15 are graphs illustrating waveforms of an erasing voltage and a channel potential according to at least one example embodiment.
Figure 15:
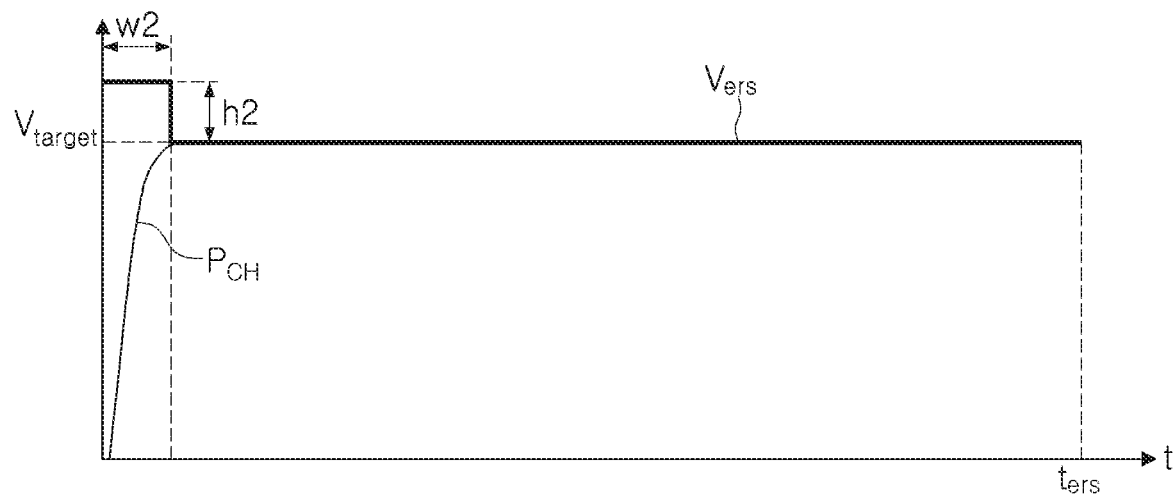

FIGS. 14 and 15 are graphs illustrating waveforms of an erasing voltage and a channel potential according to at least one example embodiment. FIG. 14 illustrates at least one example embodiment in which an erasing voltage $V_{ers}$ is stepped up until the erasing voltage $V_{ers}$ reaches a target voltage (for example, $V_{target}$=15V) from an initial voltage (for example, 0V), and FIG. 15 illustrates at least one example embodiment in which an erasing voltage $V_{ers}$ reaches a target voltage (for example, $V_{target}$=15V) without being stepped up.

Referring to FIG. 14, during an erasing operation of a semiconductor device, an overshoot erasing voltage having a unit step pulse width w1 and a unit step voltage magnitude h1 may be applied after an erasing voltage $V_{ers}$ reaches a target voltage (for example, 15V). The overshoot erasing voltage may be stepped up N times. After the erasing voltage $V_{ers}$ is additionally stepped up N times, it may be stepped down again to the target voltage. Accordingly, when the overshoot OS is present in the erasing voltage $V_{ers}$, a channel potential PCH may be increased more rapidly than when the overshoot OS is not present.

As described above, a unit step pulse width w1 of an overshoot erasing voltage may be, for example, 10% or less of total erasing time $t_{ers}$, and a unit step voltage magnitude h1 of the overshoot erasing voltage may be, for example, 10% or less of the target erasing voltage (for example, $V_{target}$=15V), but the example embodiments are not limited thereto.

Referring to FIG. 15, during an erasing operation of a semiconductor device, an overshoot erasing voltage having a unit step pulse width w2 and a unit step voltage magnitude h2 may be applied when the erasing voltage $V_{ers}$ is applied first. The overshoot erasing voltage may be stepped up N times. After the erasing voltage $V_{ers}$ is additionally stepped up N times, it may be stepped down again to a target voltage.

As described above, a unit step pulse width w2 of the overshoot erasing voltage may be, for example, 10% or less of the total erasing time $t_{ers}$, and a unit step voltage magnitude h2 of the overshoot erasing voltage may be, for example, 10% or less of a target erasing voltage (for example, $V_{target}$=15V), but the example embodiments are not limited thereto.

Figure 16:
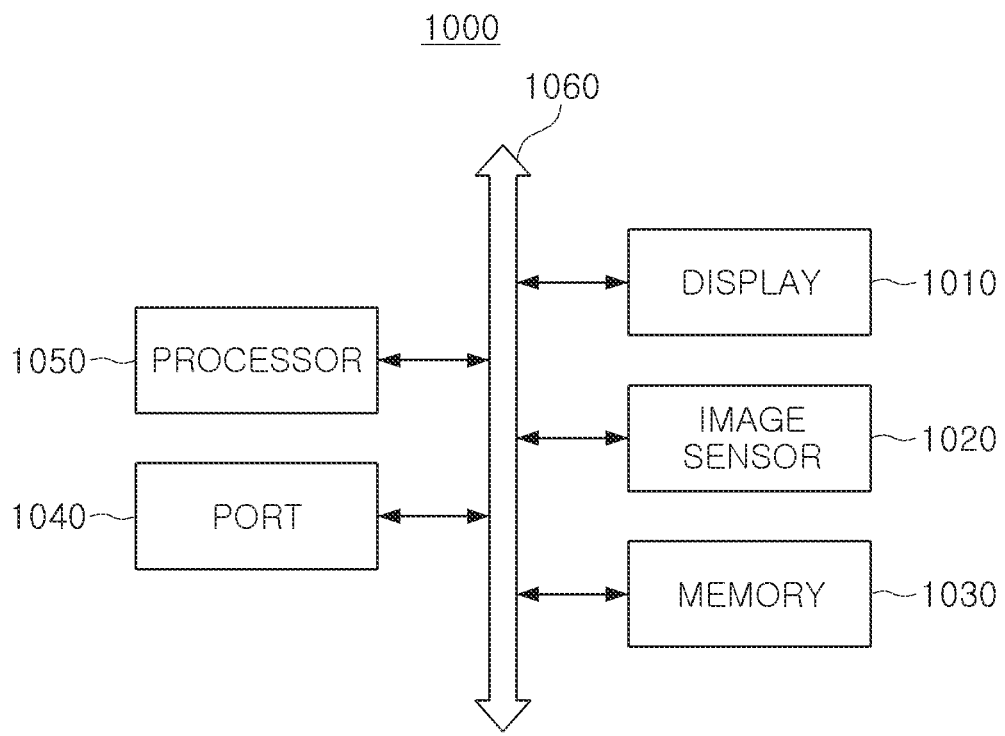
FIG. 16 is a block diagram of an electronic device including a memory device according to at least one example embodiment.

FIG. 16 is a block diagram of an electronic device including a memory device according to at least one example embodiment.

An electronic device 1000 according to at least one example embodiment illustrated in FIG. 16 may include a display 1010, an image sensor 1020, a memory 1030, a port 1040, at least one processor 1050, and the like. The electronic device 1000 may further include a wired/wireless communications device, a power supply, and the like. Among the components illustrated in FIG. 16, the port 1040 may be a device provided for the electronic device 1000 to communicate with a video card, a sound card, a memory card, a universal serial bus (USB) device, and the like. The electronic device 1000 may be a comprehensive concept including a smartphone, a tablet personal computer (PC), a smart wearable device, and the like, as well as a general desktop PC, a laptop PC, etc.

The processor 1050 may execute a certain operation or a command, a task, and the like. The processor 1050 may be a central processing unit (CPU) or a microprocessor unit (MCU), and may communicate with the display 1010, the image sensor 1020, the memory 1030, and other devices connected to the port 1040, via a bus 1060.

The memory 1030 may be a non-transitory computer readable storage medium configured to store data necessary for operation of the electronic device 1000, and/or multimedia data, etc. The memory 1030 may include a volatile memory, such as a random access memory (RAM), etc., and/or a nonvolatile memory, such as a flash memory, etc. In addition, the memory 1030 may include at least one of a solid state drive (SSD), a hard disk drive (HDD), and/or an optical disk drive (ODD), etc., as a storage device. The memory 1030 may include any one of memory devices according to various example embodiments described above with reference to FIGS. 1 to 15, but is not limited thereto.

As described above, according to at least one example embodiment, the efficiency of the generation of a GIDL current may be increased by introducing an overshoot period in which a voltage higher than a target voltage is applied for a short time and then stepped down to the target voltage, in an erasing voltage applied to a source layer. Thus, the efficiency of a GIDL erase operation may be increased without causing an insulating material to be deteriorated.

While various example embodiments have been shown and described above, it will be apparent to those skilled in the art that modifications and variations could be made without departing from the scope of the inventive concepts as defined by the appended claims.

What is claimed is:

1. A semiconductor device comprising:
a source layer on a substrate;
a plurality of channel structures on the substrate, the plurality of channel structures each including a vertical insulating layer and a vertical channel layer, the plurality of channel structures extending in a first direction perpendicular to an upper surface of the substrate;
a plurality of gate electrodes on the source layer and spaced apart from each other along the first direction on a sidewall of each of the plurality of channel structures, and at least one gate electrode of the plurality of gate electrodes is configured to provide a gate-induced drain leakage (GIDL) line;
a common source line penetrating through the plurality of gate electrodes, the common source line extending in the first direction and electrically connected to the source layer; and
a memory controller configured to, during an erasing operation,
apply an erasing voltage to the common source line until the erasing voltage reaches a target voltage,
increase the erasing voltage to a desired step-up voltage which has a voltage level higher than a voltage level of the target voltage, for a desired step-up time period after the erasing voltage reaches the target voltage, and
reduce the erasing voltage to the target voltage after the desired step-up time period expires.

2. The semiconductor device of claim 1, wherein the desired step-up voltage is at least two step increments higher than the voltage level of the target voltage.

3. The semiconductor device of claim 1, wherein
a portion of the source layer extends along the vertical channel layer in a common source extension region; and
the common source extension region overlaps at least a portion of the GIDL line.

4. The semiconductor device of claim 1, further comprising:
an insulating layer surrounding a side surface of the common source line,
wherein the plurality of gate electrodes are electrically isolated from each other by the insulating layer.

5. The semiconductor device of claim 1, wherein the memory controller is further configured to increase the erasing voltage by stepping up the erasing voltage by step increments until the erasing voltage reaches the target voltage.

6. The semiconductor device of claim 5, wherein the increase of the erasing voltage during the desired step-up time period has a pulse width equal to a pulse width of a unit step voltage of the erasing voltage.

7. The semiconductor device of claim 5, wherein the increase of the erasing voltage during the desired step-up time period has a voltage magnitude equal to a voltage magnitude of a unit step voltage of the erasing voltage.

8. The semiconductor device of claim 5, wherein the increase of the erasing voltage during the desired step-up time period has a pulse width different from a pulse width of a unit step voltage of the erasing voltage.

9. The semiconductor device of claim 5, wherein the increase of the erasing voltage during the desired step-up time period has a voltage magnitude different from a voltage magnitude of a unit step voltage of the erasing voltage.

10. The semiconductor device of claim 1, wherein the increase of the erasing voltage during the desired step-up time period has a pulse width that is 10% or less of a total time period of the erasing operation.

11. The semiconductor device of claim 1, wherein the increase of the erasing voltage during the desired step-up time period has a voltage magnitude that is 10% or less of the target voltage.

12. The semiconductor device of claim 1, wherein the memory controller is further configured to:
increase a GIDL voltage applied to the GIDL line until the erasing voltage reaches the target voltage, the increased GIDL voltage being increased or decreased while maintaining a constant voltage difference with the erasing voltage.

13. A semiconductor device comprising:
a plurality of bitlines;
a common source line configured to receive an erasing voltage during an erasing operation;
at least one memory cell string connected between one bit line of the plurality of bitlines and the common source line, the at least one memory cell string including a plurality of memory cells, and at least one string select line connected to the one bit line;
a gate-induced drain leakage (GIDL) line electrically connected to the common source line, the GIDL line configured to receive a GIDL voltage, the received GIDL voltage being increased while maintaining a constant voltage difference with the erasing voltage until the erasing voltage reaches a target voltage during the erasing operation;
a ground select line connected to the GIDL line; and
a plurality of wordlines connected to the string select line and the ground select line;
wherein an overshoot occurs to apply a voltage higher than the target voltage after the erasing voltage, applied to the common source line, reaches the target voltage during the erasing operation.

14. The semiconductor device of claim 13, further comprising:
a string select transistor connected to the string select line, the string select transistor configured to be in a turned-off state during the erasing operation.

15. The semiconductor device of claim 13, wherein the plurality of wordlines are configured to receive a ground voltage during the erasing operation.

16. The semiconductor device of claim 13, wherein the GIDL voltage is increased by a unit step voltage while maintaining a constant voltage difference with the erasing voltage when the erasing voltage is increased by a unit step voltage, until the erasing voltage reaches the target voltage.

17. A semiconductor device comprising:
a substrate;
a source layer on an upper surface of the substrate;
a plurality of gate electrode layers, the plurality of gate electrode layers includes a lowermost gate electrode configured to provide a gate-induced drain leakage (GIDL) line;
a plurality of insulating layers, the plurality of insulating layers and the plurality of gate electrode layers stacked alternately on the source layer;
a plurality of channel structures, each of the plurality of channel structures having a vertical insulating layer and a vertical channel layer, the plurality of channel structures extending in a first direction perpendicular to the upper surface of the substrate;
a common source extension region including a portion of the source layer which extends along the vertical channel layer, the common source extension region formed to overlap at least a portion of the GIDL line; and
a memory controller configured to provide a high magnitude voltage to the source layer during an erasing operation, the high magnitude voltage having a magnitude greater than a magnitude of an erasing voltage of the erasing operation.

18. The semiconductor device of claim 17, wherein the memory controller is further configured to:
generate an increasing GIDL voltage during a first period of the erasing operation, the increasing GIDL voltage having a first voltage difference that is maintained with the erasing voltage until the erasing voltage reaches a target voltage, wherein a lateral field is generated based on the first voltage difference between the GIDL voltage and the erasing voltage;
increase a voltage level of the erasing voltage to at least one step higher than a voltage level of the target voltage during a second period of the erasing operation after the erasing voltage reaches the target voltage, the increasing the voltage level of the erasing voltage including establishing a second voltage difference between the erasing voltage and the GIDL voltage, the second voltage difference being greater than the first voltage difference, wherein the lateral field is increased by the second voltage difference;
decrease the erasing voltage to the target voltage after the voltage level of the erasing voltage is increased; and
maintain the erasing voltage at the target voltage during a third period of the erasing operation following the second period, the maintaining the erasing voltage including maintaining the first voltage difference between the erasing voltage and the GIDL voltage.

19. The semiconductor device of claim 18, wherein the first voltage difference causes a portion of the vertical channel layer to accumulate holes as electrons of the vertical channel layer migrate to the common source extension region.

20. The semiconductor device of claim 19, wherein the second voltage difference causes an increase in speed of the electrons of the vertical channel layer to migrate to the common source extension region.

* * * * *